United States Patent [19]

Nakagawa et al.

[11] Patent Number: 4,643,912
[45] Date of Patent: Feb. 17, 1987

[54] METHOD FOR FORMING A METAL LAYER WITH PATTERN ON A SUBSTRATE

[75] Inventors: Shigeru Nakagawa; Kiyotaka Uchikawa, both of Kanagawa, Japan

[73] Assignee: Marui Industry Co., Ltd., Tokyo, Japan

[21] Appl. No.: 655,099

[22] Filed: Sep. 27, 1984

Related U.S. Application Data

[63] Continuation-in-part of Ser. No. 546,304, Oct. 28, 1983, abandoned.

[30] Foreign Application Priority Data

Oct. 29, 1982 [JP] Japan ................... 57-190161

[51] Int. Cl.$^4$ .................. B05D 3/12; B05D 5/00; C23C 14/04
[52] U.S. Cl. .................... 427/57; 427/259; 427/264
[58] Field of Search .................. 427/57, 259, 264, 99; 204/192 R, 192 N

[56] References Cited

U.S. PATENT DOCUMENTS

| | | | |
|---|---|---|---|
| 3,617,373 | 11/1971 | Mott | 427/259 X |
| 3,935,334 | 1/1976 | Narui et al. | 427/259 |
| 4,216,246 | 8/1980 | Iwasaki et al. | 427/404 |
| 4,242,378 | 12/1980 | Arai | 427/264 |
| 4,254,163 | 3/1981 | Piazza | 427/259 |
| 4,270,985 | 6/1981 | Lipson et al. | 427/259 |
| 4,315,970 | 2/1982 | McGee | 427/404 |
| 4,396,666 | 8/1983 | Ernsberger | 427/229 |

FOREIGN PATENT DOCUMENTS

| | | |
|---|---|---|
| 340163 | 9/1959 | Switzerland . |
| 957292 | 5/1964 | United Kingdom . |
| 1020664 | 2/1966 | United Kingdom . |

*Primary Examiner*—Evan K. Lawrence
*Attorney, Agent, or Firm*—Wenderoth, Lind & Ponack

[57] ABSTRACT

A method for forming a metal layer with a positive pattern on a plastic sheet or plate substrate which comprises printing an oil-soluble, water-insoluble ink on the substrate to provide a negative pattern, forming a metal layer on said substrate by dry metal plating, immersing the substrate in a hydrocarbon having 6–17 carbon atoms, preferably kerosene, and removing the ink layer and metal layer thereon by applying supersonic vibration to the substrate in the kerosene.

4 Claims, 3 Drawing Figures

METHOD FOR FORMING A METAL LAYER WITH PATTERN ON A SUBSTRATECL CROSS-REFERENCE TO RELATED APPLICATION

This application is a continuation-in-part application of Ser. No. 546,304 filed on Oct. 28, 1983, now abandoned.

BACKGROUND OF THE INVENTION

This invention relates to a method for forming a metal layer with a positive pattern on a substrate.

It has been known in the prior art that such a metal layer with pattern may be formed by partially electroless plating or by etching of a metal-clad substrate.

Partially electroless plating comprises the steps of:
printing a desired pattern on a substrate with an agent which can prevent metal deposit by electroless plating, carrying out electroless plating on the substrate, and
carrying out electrolytic plating on the electroless plating layer.

However, this method has the defect that electric current concentrates at the border-line portion of the electroless plating layer during electrolytic plating, whereby metal deposits in the form of needles or grains are formed. To avoid this defect, it is necessary that the metal layer be made relatively thin. However, making the metal layer thin reduces the durability of the substrate. Furthermore, the kinds of substrates which may plated are limited.

The prior art method for etching a metal-clad substrate comprises the following steps:
coating the metal with a photosensitizer;
exposing the photosensitizer to actinic radiation through a positive or negative with a desired pattern;
washing the exposed area (if a positive is used) or the unexposed area (if a negative is used); and
removing the metal layer, on which the photoresist is not present, by etching it using a strong acid or strong alkali.

Depending on the etching method, it is necessary to treat the acidic or alkaline waste so as not to cause water or air pollution. Furthermore, the photoresist must be removed in order to use the resulting substrate for decorative purposes.

U.S. Pat. No. 3,935,334 issued on Jan. 27, 1976 based on an application filed by Narui et al discloses a process for producing a metallized resin film for a condenser element comprising at least one dielectric resinous layer and at least one metal deposition layer, wherein the improvement comprises forming on said resinous layer a margin wherein the metal deposition layer is not present by the steps comprising
1. providing a water-soluble coating layer by applying a water-soluble paint to at least one side of the dielectric resinous layer in the portion of the resinous layer corresponding to the pattern of margin,
2. providing a metal deposition layer on the dielectric resinous layer partially coated with the water-soluble coating layer, said metal deposition layer being applied by means of vacuum metallizing procedures, and
3. removing the water-soluble coating layer and the metal deposition layer thereon by dissolving away the water-soluble coating layer with water.

The process of Narui et al has the following defects:
(a) The water-soluble ink is not completely bonded to the resinous material. Therefore, the contours of the resulting metal layer are not sharp.
(b) Water remains in the ink layer after it has been coated on the resin. The water disturbs the metallizing operation under vacuum.

SUMMARY OF THE INVENTION

Accordingly, an object of this invention is to provide a method for forming a metal layer with a desired pattern on a substrate not having the above mentioned defects in the prior art.

This invention relates to a method for forming a metal layer with a positive pattern on a plastic sheet or plate substrate, which comprises printing an oil soluble, water-insoluble ink on the substrate to provide a negative pattern, forming a metal layer on said substrate by dry metal plating, immersing the substrate in a hydrocarbon having 6–17 carbon atoms, preferably kerosene, and removing said ink layer and metal layer on the ink layer by applying supersonic vibration to the substrate.

DETAILED DESCRIPTION OF THE INVENTION

Examples of the substrates employed in the practice of this invention include plates or sheets of plastics, such as polycarbonate, ABS resin, polyphenylene oxide epoxy resin, phenolic resin, and poly(meth)acrylate resin. Polyacrylate resin sheet or plate is preferable.

Any inks which are oil-soluble and water-insoluble are usable in the present invention. Such inks are commercially available as gravure ink. Inks in which the ratio of pigment to binder resin is at least 3 to 1 are preferable because such inks are likely to be removed from the substrate by means of supersonic vibration.

It is critical that the hydrocarbons employed in the present invention have 6–17 carbon atoms. Kerosene is preferable as a hydrocarbon. Hydrocarbons having 5 or less carbon atoms are too volatile and smelly. Organic solvents having a polar group, such as methyl ethyl ketone or aromatic solvents, have a bad effect on the substrate. Hydrocarbons having 6–17 carbon atoms or mixtures thereof are usable. The mixtures are preferable, because they are less expensive.

Examples of the metal formed on the substrate include Cu, Sn, Cr, Ag, Au, Ni, Fe, Zn, Al, or alloys thereof.

The ink may be applied to the substrate by screen printing.

Examples of dry plating processes include vacuum metallizing, sputtering, and ion plating.

Prior to printing the ink, the substrate may be coated with an organic-based paint (primer).

Examples of the primer coating agents include acryl urethane, polyester urethane, and the like.

The supersonic vibration may be carried out at 20–35 Khz; and electric power of 120–220 W and at 10–60 seconds.

This invention is further explained by the following non-limiting embodiment.

Figure 1:
FIG. 1 is a section-view of a substrate to which an oil-soluble, water-insoluble ink has been applied in the form of a desired pattern.

In FIG. 1, an ink layer 1 is applied to a substrate 2. The ink is selectively applied to the substrate by means of screen printing, etc to provide a negative pattern.

Figure 2:
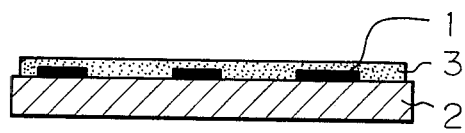
FIG. 2 is a section-view of the substrate on which a metal layer has been formed.

In FIG. 2, a metal layer 3 is formed on the substrate by means of vacuum metallizing, sputtering, or ion plating.

Figure 3:
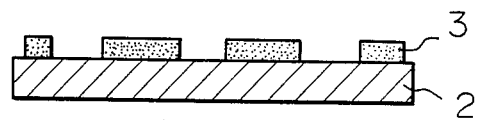
FIG. 3 is a section-view of a final product obtained according to the present invention.

The substrate shown in FIG. 2 is immersed in a specific hydrocarbon and supersonic vibration is applied to the substrate to remove the ink layer and the metal layer thereon, thereby forming a metal layer with a positive pattern. FIG. 3 shows a section-view of the product.

The advantages of this invention are as follows:
(i) The pattern of the metal layer formed on the resulting product is sharp.
(ii) Since the ink is free from water, the dry metal plating operation is not impaired.
(iii) Since strong acids and strong alkalis are not used, treatment of waste is unnecessary.

One application of the product produced according to the present invention is as a component of a display on the instrument panel of an automobile. A light placed below the plate allows the driver to read the words defined by the area left undeposited with a metal layer. Another application of the product is decorative display.

Preferable examples of this invention are illustrated in the following:

EXAMPLE 1

A coating agent comprising acrylate-urethane resin was coated on a transparent acrylate resin plate and dried at 85° C. for 2 hours. Then ink comprising terpene and a pigment was selectively applied to the plate by screen printing. The ink layer was 20 microns thick. Nickel type alloy was formed on the plate by sputtering ($5 \times 10^{-3}$ torr). The metal layer was 1500 Å thick. The plate was immersed in the following hydrocarbon mixture:

$C_5$: 5%
$C_{10}$: 20%
$C_{11}$: 25%
$C_{12}$: 20%
$C_{13}$: 20% $C_{14}$: 10%

Supersonic vibration was applied to the plate for 30 seconds.

The ink layer and the metal layer thereon were removed from the plate, whereby a sharp pattern was obtained.

EXAMPLE 2

Ink was selectively applied to a carbonate resin plate. Copper-tin-chromium alloy was formed on the plate by vacuum metallizing ($2 \times 10^{-5}$ Torr). The metal layer was 1500 Å thick. The plate was immersed in n-hexane. Supersonic vibration was applied to the plate for 1 minute. The ink layer and the metal layer thereon were removed from the plate. The resulting pattern was sharp.

CONTROL RUN 1

The procedure of Example 1 was repeated except that a water-soluble ink comprising water-soluble silicone ink was used in place of the ink of Example 1. The ink layer was 5 microns thick. The resulting plate was immersed in water and supersonic vibration was applied to the plate. The ink layer was not removed from the plate.

What is claimed is:

1. A method for forming a metal layer with a positive pattern on a plastic sheet or plate substrate selected from the group consisting of polycarbonate, ABS resin, polyacrylate resin, polyphenylene oxide epoxy resin, and polymethacrylate resin, which comprises printing an oil-soluble, water-insoluble ink on a surface of said substrate to provide an ink layer of a negative pattern, forming a metal layer on the entire printed surface of said substrate, including said ink layer, by dry metal plating, immersing said substrate in kerosene, and removing said ink layer and that part of said metal layer which is on said ink layer by applying supersonic vibration to said substrate in said kerosene.

2. The method of claim 1 including the further step of coating said substrate with an organic-based paint prior to printing the ink.

3. The method of claim 1 wherein the dry metal plating is vacuum metallizing, sputtering, or ion plating.

4. The method of claim 1 wherein said ink is applied to said substrate by screen printing.

* * * * *